United States Patent
Kang et al.

(10) Patent No.: US 9,065,068 B2
(45) Date of Patent: Jun. 23, 2015

(54) ORGANIC LIGHT EMITTING DISPLAY DEVICE

(71) Applicant: LG Display Co., Ltd., Seoul (KR)

(72) Inventors: Hye-Seung Kang, Gimpo-si (KR); Tae-Il Kum, Paju-si (KR); Young-Kwan Jung, Daegu (KR); Hyung-June Kim, Paju-si (KR); Jung-Soo Park, Seoul (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 14/496,287

(22) Filed: Sep. 25, 2014

(65) Prior Publication Data

US 2015/0090984 A1    Apr. 2, 2015

(30) Foreign Application Priority Data

Oct. 2, 2013  (KR) .......................... 10-2013-0117760

(51) Int. Cl.
*H01L 51/52* (2006.01)
*H01L 51/50* (2006.01)
*H01L 27/32* (2006.01)
*H01L 51/56* (2006.01)

(52) U.S. Cl.
CPC ............... *H01L 51/52* (2013.01); *H01L 27/32* (2013.01); *H01L 51/5056* (2013.01); *H01L 51/5072* (2013.01); *H01L 51/56* (2013.01)

(58) Field of Classification Search
CPC . H01L 27/32; H01L 27/3202; H01L 27/3204; H01L 27/3209; H01L 27/3225; H01L 51/50; H01L 51/5287; H01L 2227/32; H01L 2227/326; H01L 2251/5323; H01L 2251/566; H01L 2924/12044
See application file for complete search history.

(56) References Cited

U.S. PATENT DOCUMENTS

2013/0240847 A1* 9/2013 Zakhidov et al. ............... 257/40

* cited by examiner

*Primary Examiner* — Hoai V Pham
(74) *Attorney, Agent, or Firm* — McKenna Long & Aldridge LLP

(57) ABSTRACT

Disclosed is an organic light emitting display (OLED) device that may include first and second electrodes facing each other on a substrate, at least two light emitting units between the first and second electrodes, and a charge generation layer between the at least two light emitting units, the charge generation layer including an N-type charge generation layer and a P-type charge generation layer, wherein the N-type charge generation layer includes at least two hosts and a dopant, and wherein the at least two hosts have different lowest unoccupied molecular orbital (LUMO) energy levels.

20 Claims, 12 Drawing Sheets

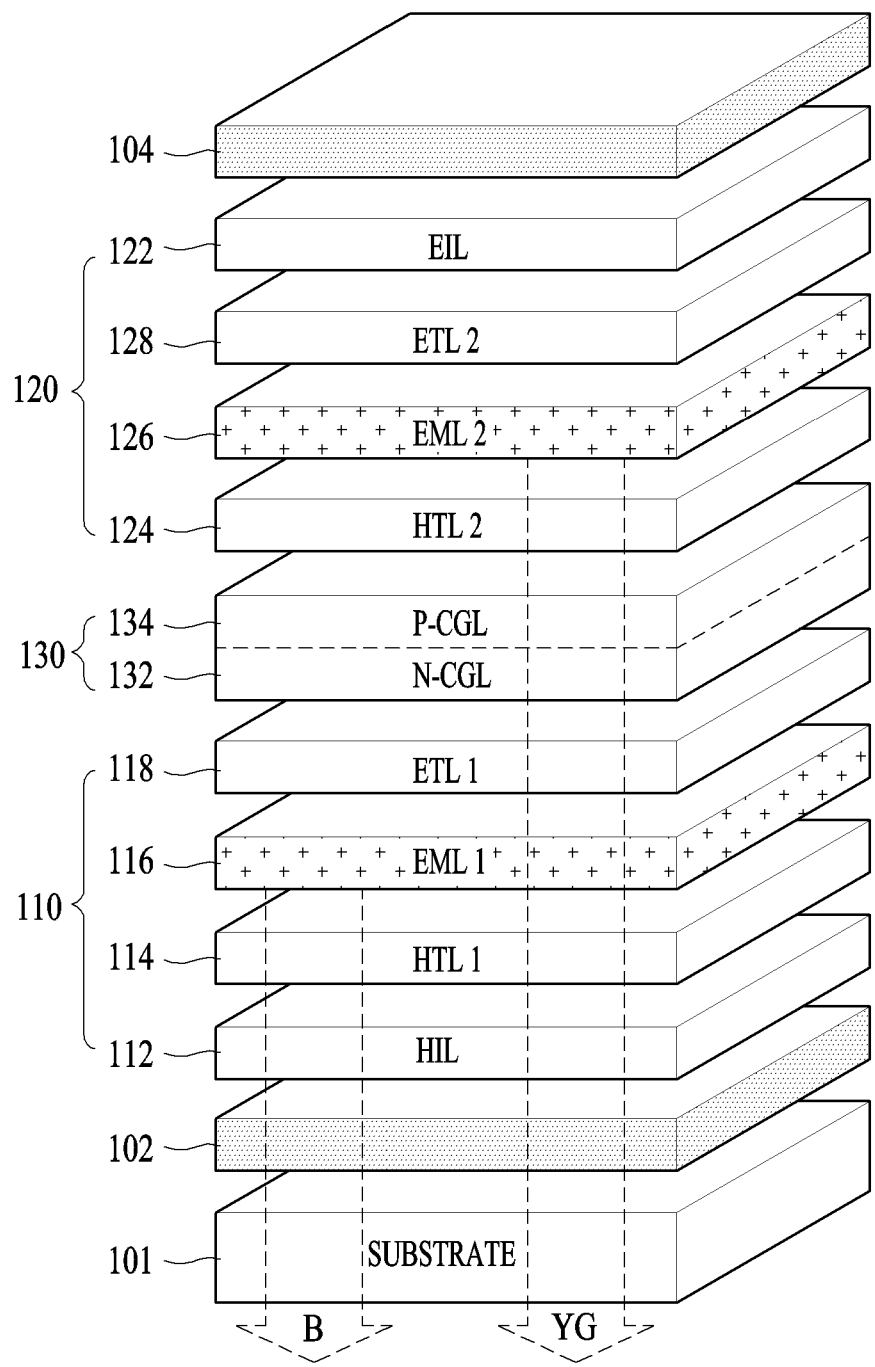

ORGANIC LIGHT EMITTING DISPLAY DEVICE

This application claims the benefit of Korean Patent Application No. 10-2013-0117760, filed on Oct. 2, 2013, which is hereby incorporated by reference as if fully set forth herein.

BACKGROUND OF THE INVENTION

1. Field of the Invention

The present invention relates to an organic light emitting display (OLED) device with low drive voltage and high luminous efficiency, and a method for manufacturing the same.

2. Discussion of the Related Art

In line with recent developments in information era, there has been rapid advancement in the display field. To meet such development, various flat panel display devices with excellent performance, such as ultra-thin thickness, lightweight and low power consumption, have been developed.

Examples of flat panel display devices include, without limitation, liquid crystal display (LCD) devices, plasma display panel (PDP) devices, field emission display (FED) devices, and organic light emitting display (OLED) devices.

In particular, OLED devices, which are a self-emissive device, have faster response time, higher luminous efficiency, higher luminance and wider viewing angle compared with other flat panel display devices. OLED devices typically include an anode, a hole injection layer, a hole transport layer, an emission layer, an electron transport layer, an electron injection layer, and a cathode.

OLED devices typically have a single light emitting unit structure including a hole injection layer, a hole transport layer, an emission layer, an electron transport layer, and an electron injection layer disposed between first and second electrodes. In recent years, however, OLED devices having a multi-light emitting unit structure including a plurality of light emitting units disposed between first and second electrodes have been developed.

In the conventional multi-light emitting unit structure, a plurality of organic layers are provided between the first and second electrodes, which leads to an increased drive voltage. In addition, OLED device having the conventional multi-light emitting unit structure may not provide luminous efficiency proportional to the number of the light emitting layers as compared with OLED devices having a single light emitting unit structure.

SUMMARY OF THE INVENTION

Accordingly, the present invention is directed to an organic light emitting display (OLED) device and method for manufacturing the same that substantially obviates one or more problems due to limitations and disadvantages of the related art.

An advantage of the present invention is to provide an OLED device with low drive voltage and high luminous efficiency, and a method for manufacturing the same.

Additional features and advantages of the invention will be set forth in the description which follows, and in part will be apparent from the description, or may be learned by practice of the invention. These and other advantages of the invention will be realized and attained by the structure particularly pointed out in the written description and claims hereof as well as the appended drawings.

To achieve these and other advantages and in accordance with the purpose of the present invention, as embodied and broadly described, an organic light emitting display (OLED) device may, for example, include first and second electrodes facing each other on a substrate, at least two light emitting units between the first and second electrodes, and a charge generation layer between the at least two light emitting units, the charge generation layer including an N-type charge generation layer and a P-type charge generation layer, wherein the N-type charge generation layer includes at least two hosts and a dopant, and wherein the at least two hosts have different lowest unoccupied molecular orbital (LUMO) energy levels.

In another aspect of the present invention, an organic light emitting display (OLED) device may, for example, include first and second electrodes facing each other on a substrate, at least two light emitting units between the first and second electrodes, and a charge generation layer between the light emitting units, the charge generation layer including an N-type charge generation layer and a P-type charge generation layer, wherein one of the at least two light emitting units includes a hole transport layer on the first electrode, an emission layer on the hole transport layer, and an electron transport layer on the emission layer, the N-type charge generation layer including at least two hosts having different LUMO energy levels and a dopant, and the electron transport layer including any one of the at least two hosts in the N-type charge generation layer.

The N-type charge generation layer may have a multi-layer or single-layer structure including first and second hosts and a dopant.

A difference between the LUMO energy level of the first host and the LUMO energy level of the second host may be 0.1 eV or more, and a difference between a highest occupied molecular orbital (HOMO) energy level of the first host and a HOMO energy level of the second host may be 0.1 eV or more.

A ratio of the second host to the first host in the N-type charge generation layer may be 5 to 95% and a doping ratio of the dopant to the sum of the first and second hosts in the N-type charge generation layer may be 1 to 8%.

The dopant may be formed of an alkali metal or an alkali earth metal and have a work function of −2.5 eV to −3.2 eV.

The N-type charge generation layer may have a multi-layer structure including a first N-type charge generation layer formed of the first host and the dopant, a second N-type charge generation layer formed of the second host and the dopant, and a third N-type charge generation layer formed of the first and second hosts and the dopant.

The first to third N-type charge generation layers may each have a thickness of 10 to 500 Å.

The N-type charge generation layer may have a multi-layer structure including a first N-type charge generation layer formed of the first host and the dopant and a second N-type charge generation layer formed of the second host and the dopant.

The first and second N-type charge generation layers may each have a thickness of 10 to 500 Å.

The electron transport layer may have a thickness of 100 to 500 Å.

In yet another aspect of the present invention, a method for manufacturing an organic light emitting display (OLED) device, the method may, for example, including forming a first electrode on a substrate; forming a first light emitting unit on the first electrode; forming a charge generation layer on the first light emitting unit, the charge generation layer including a first host, a second host and a dopant; forming a second light emitting unit on the charge generation layer; and forming a second electrode on the second light emitting unit, wherein LUMO energy levels of the first host and the second host are different by about 0.1 eV or more, and wherein HOMO energy levels of the first host and the second host are different by about 0.1 eV or more.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings:

FIG. 1 is a perspective view illustrating OLED device according to the first embodiment of the present invention;

DETAILED DESCRIPTION OF THE ILLUSTRATED EMBODIMENTS

Figure 2A:
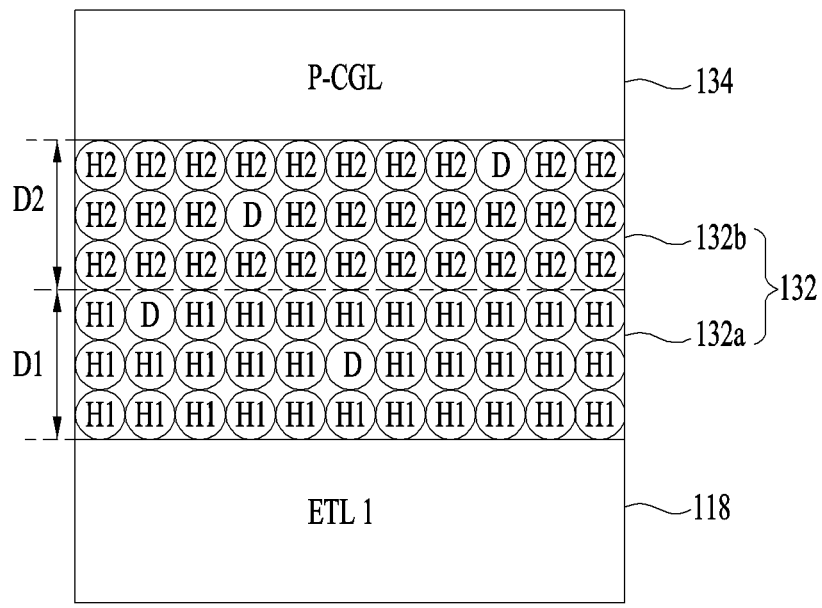
FIGS. 2A to 2C are sectional views illustrating various embodiments of an N-type charge generation layer shown in FIG. 1.

Reference will now be made in detail to embodiments of the present invention, examples of which are illustrated in the accompanying drawings. The same reference numbers may be used throughout the drawings to refer to the same or like parts.

FIG. 1 is a perspective view illustrating an organic light emitting display (OLED) device according to the first embodiment of the present invention.

Referring to FIG. 1, the OLED device includes first and second electrodes 102 and 104 facing each other on a substrate 101, first and second light emitting units 110 and 120 formed between the first and second electrodes 102 and 104, and a charge generation layer 130 provided between the first and second light emitting units 110 and 120.

At least one of the first and second electrodes 102 and 104 is formed of a semi-transparent electrode. In a case in which the first electrode 102 is a semi-transparent electrode and the second electrode 104 is a reflective electrode, the OLED device is a rear light emitting structure in which light is emitted downward. In a case in which the second electrode 104 is a semi-transparent electrode and the first electrode 102 is a reflective electrode, the OLED device is a front light emitting structure in which light is emitted upward. Alternatively, both the first and second electrodes 102 and 104 may be formed of a transparent electrode such that the OLED device is a double-side light emitting structure in which light is emitted upward and downward The semi-transparent electrode is formed of a transparent conductive material, such as indium tin oxide (ITO) or indium zinc oxide (IZO), and an opaque conductive material, such as aluminum (Al), gold (Au), molybdenum (MO), chrome (Cr), copper (Cu), or LiF. The reflective electrode is formed of a reflective metal material, such as aluminum (Al), gold (Au), molybdenum (MO), chrome (Cr), copper (Cu), or LiF, or has a multi-layered structure using the same.

This embodiment will now be described with a case where the first electrode 102 severing as an anode is formed of a semi-transparent electrode and the second electrode 104 serving as a cathode is formed of a reflective electrode by way of example.

The first light emitting unit 110 is formed between the first electrode 102 and an N-type charge generation layer 132. The first light emitting unit 110 includes a hole injection layer (HIL) 112, a first hole transport layer (HTL1) 114, a first emission layer (EML1) 116, and a first electron transport layer (ETL1) 118 sequentially formed on the first electrode 102. The first hole transport layer 114 supplies holes from the first electrode 102 to the first emission layer 116. The first electron transport layer 118 supplies electrons from the N-type charge generation layer 132 to the first emission layer 116. In the first emission layer 116, the holes supplied through the first hole transport layer 114 and the electrons supplied through the first electron transport layer 118 are re-coupled to generate light.

The second light emitting unit 120 is formed between the second electrode 104 and a P-type charge generation layer 134. The second light emitting unit 120 includes a second hole transport layer (HTL2) 124, a second emission layer (EML2) 126, a second electron transport layer (ETL2) 128, and an electron injection layer (EIL) 122 sequentially formed on the P-type charge generation layer 134. The second hole transport layer 124 supplies holes from the P-type charge generation layer 134 to the second emission layer 126. The second electron transport layer 128 supplies electrons from the second electrode 104 injected through the electron injection layer 122 to the second emission layer 126. In the second emission layer 126, the holes supplied through the second hole transport layer 124 and the electrons supplied through the second electron transport layer 128 are re-coupled to generate light.

The first emission layer 116, which is an emission layer including a fluorescent or phosphorescent blue dopant and a host, emits a blue light and the second emission layer 126, which is an emission layer including a fluorescent or phosphorescent yellow-green dopant and a host, emits a yellow-green light to generate a white light. Alternatively, other fluorescent or phosphorescent dopants may be used to generate a white light.

The N-type charge generation layer 132 and the P-type charge generation layer 134 are sequentially stacked to constitute the charge generation layer 130.

The P-type charge generation layer 134 is formed between the N-type charge generation layer 132 and the second hole transport layer 124 to generate holes and electrons. The holes generated by the P-type charge generation layer 134 are injected into the second hole transport layer 124 of the second light emitting unit 120. The electrons generated by the P-type charge generation layer 134 are injected into the N-type charge generation layer 132.

The N-type charge generation layer 132 is formed between the P-type charge generation layer 134 and the first electron transport layer 118 to inject and transport the electrons injected from the P-type charge generation layer 134 into and to the first electron transport layer 118.

The N-type charge generation layer 132 includes at least two hosts formed of different materials and a dopant. In this embodiment, the N-type charge generation layer 132 includes first and second hosts H1 and H2 formed of different materials and a dopant D by way of example.

Figure 2B:
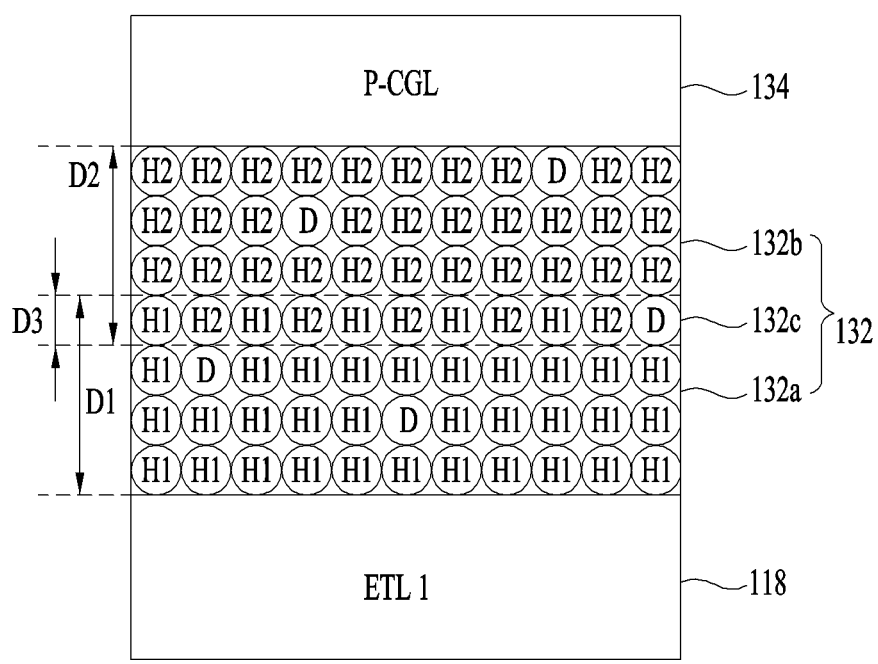
Figure 2C:
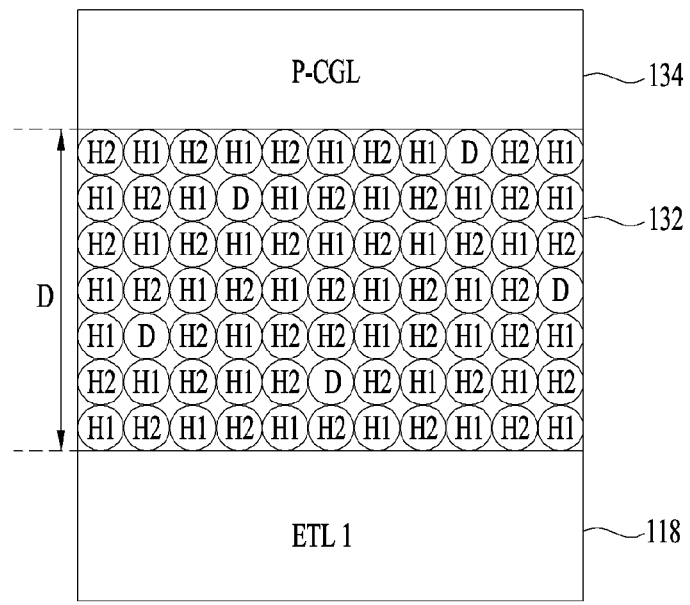

The N-type charge generation layer 132 may have a multi-layer structure as illustrated in FIGS. 2A and 2B or a single-layer structure as illustrated in FIG. 2C.

The N-type charge generation layer 132 illustrated in FIG. 2A includes first and second N-type charge generation layers 132a and 132b. The first N-type charge generation layer 132a is formed by mixing the first host H1 and the dopant D on the first electron transport layer 118. The second N-type charge generation layer 132b is formed by mixing the second host H2 and the dopant D on the first N-type charge generation layer 132a. Thicknesses D1 and D2 of the first and second N-type charge generation layers 132a and 132b may be in a range of about 10 Å to about 500 Å.

The N-type charge generation layer 132 illustrated in FIG. 2B includes first to third second N-type charge generation layers 132a, 132b, and 132c. The first N-type charge generation layer 132a is formed by mixing the first host H1 and the dopant D on the first electron transport layer 118. The second N-type charge generation layer 132b is formed by mixing the second host H2 and the dopant D on the third N-type charge generation layer 132c. The third N-type charge generation layer 132c is formed by mixing the first and second hosts H1 and H2 and the dopant D between the first and second N-type charge generation layers 132a and 132b. In the N-type charge generation layer 132, a thickness D1 of a region in which the first host H1 is formed and a thickness D2 of a region in which the second host H2 is formed may be in a range of about 10 Å to about 500 Å. A thickness D3 of a region in which the first host H1 and the second host H2 are formed in a mixed state, i.e. the third N-type charge generation layer 132c, may be in a range of about 10 Å to about 500 Å.

The N-type charge generation layer 132 illustrated in FIG. 2C is formed by mixing the first and second hosts H1 and H2 and the dopant D. That is, the N-type charge generation layer 132 has a single-layer structure. The N-type charge generation layer 132 may have a thickness D in a range of about 10 Å to about 500 Å.

In the N-type charge generation layer 132 illustrated in FIGS. 2A to 2C, a ratio of the second host H2 to the first host H1 may be in a range of about 5% to about 95%. In the N-type charge generation layer 132, a doping ratio of the dopant D to the sum of the first and second hosts H1 and H2 may be in a range of about 1% to about 8%. The dopant D may be formed of an alkali metal or an alkali earth metal, such as Ca, Li, Mg, or Yb, and may have a work function of about −2.5 eV to about −3.2 eV.

Figure 3:
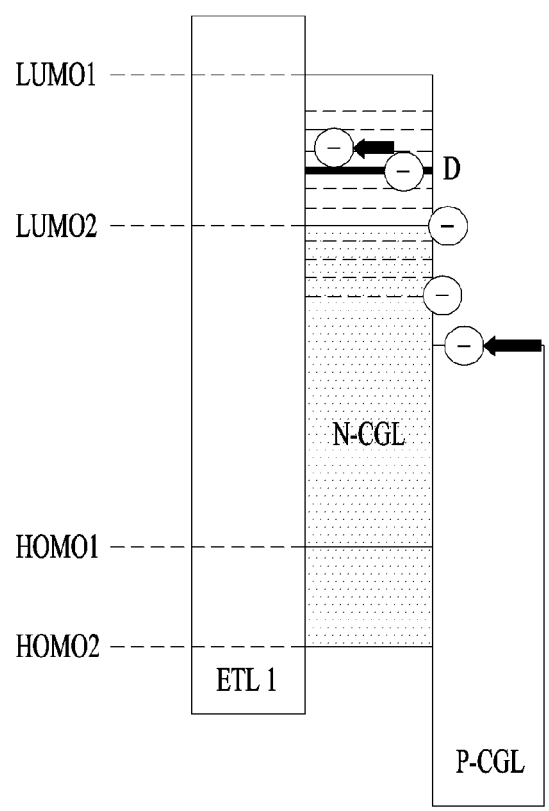
FIG. 3 is a view illustrating an electron movement channel between a P-type charge generation layer and an electron transport layer shown in FIGS. 2A to 2C.

As illustrated in FIG. 3, the first and second hosts H1 and H2 have different lowest unoccupied molecular orbital (LUMO) energy levels and different highest occupied molecular orbital (HOMO) energy levels. For example, the difference between the LUMO energy level (LUMO1) of the first host H1 and the LUMO energy level (LUMO2) of the second host H2 may be about 0.1 eV or more and the difference between the HOMO energy level (HOMO1) of the first host H1 and the HOMO energy level (HOMO2) of the second host H2 may be about 0.1 eV or more.

Because the N-type charge generation layer 132 has at least two hosts as described above, the charge generation layer may have plural energy levels. In particular, at least two hosts and a dopant constituting the N-type charge generation layer 132 are co-deposited to generate a plurality of energy levels. These energy levels are used as movement channels through which electrons generated by the P-type charge generation layer 134 are injected as illustrated in FIG. 3.

In an OLED device according to an embodiment of the present invention, electrons may thus move to the first emission layer 116 faster as compared with the conventional art, an energy barrier between the P-type charge generation layer 134 and the N-type charge generation layer 132 may be reduced or minimized, and a tunneling effect may be maximized. As a result, drive voltage may be lowered. In addition, in this embodiment, an amount of electrons is increased with the increase of the movement channels through which the electrons may be injected. Also, the balance between holes and electrons may be uniform, whereby luminous efficiency may be improved and an occurrence of a roll-off phenomenon may be restrained. In particular, electrons are injected into the first light emitting unit 110, which is, for example, a blue light emitting unit located under the N-type charge generation layer 132, through the N-type charge generation layer 132. As a result, luminous efficiency of the blue light emitted from the first light emitting unit 110 may be improved, thereby increasing luminous efficiency of the white light and reducing power consumption of the OLED device.

FIGS. 4A to 6C and Tables 1 to 3 show characteristics of a white organic light emitting device according to the first embodiment of the present invention. In FIGS. 4A to 6C and Tables 1 to 3, the comparative example includes an N-type charge generation layer formed of Bphen and the example includes an N-type charge generation layer 132 in which one of first and second hosts H1 and H2 is formed of a pyrene derivative having a phenanthroline substituent and the other of the first and second hosts H1 and H2 is formed of Bphen. In this embodiment, materials of the first and second hosts H1 and H2 are merely illustrative for explanation purposes, and the present invention is not limited thereto.

Table 1 shows characteristics of a second light emitting unit generating a yellow-green light of the white organic light emitting device according to the first embodiment of the present invention and a comparative example.

TABLE 1

| N-type charge generation layer | 10 mA/cm$^2$ | | |
| --- | --- | --- | --- |
| | Drive voltage (V) | Luminous efficiency (cd/A) | External quantum efficiency EQE (%) |
| Comparative example | 3.7 | 75.7 | 22.3 |
| Example | 3.5 | 76.2 | 22.5 |

Figure 4A:
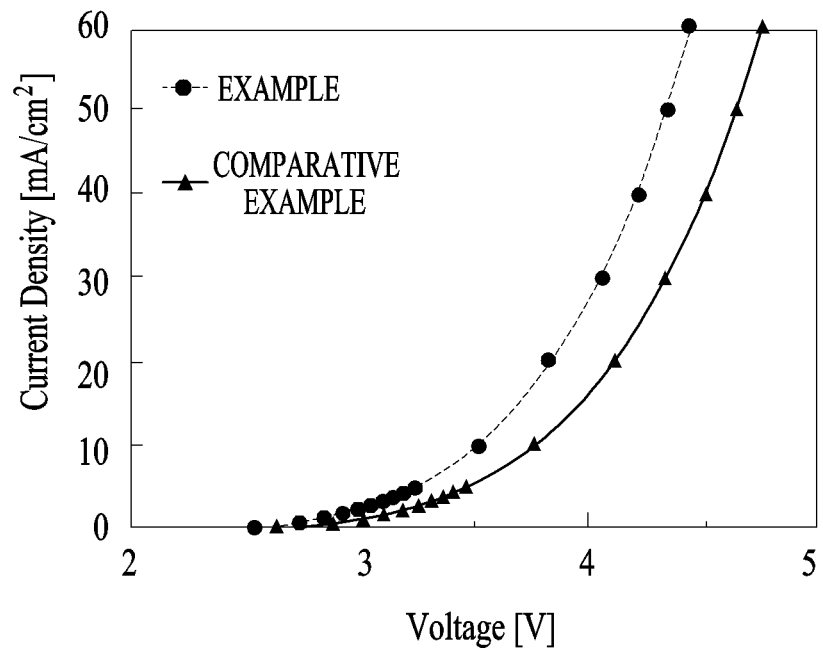
FIGS. 4A and 4B are graphs showing characteristics of a second light emitting unit generating a yellow-green light illustrated in FIG. 1 and a comparative example.
Figure 4B:
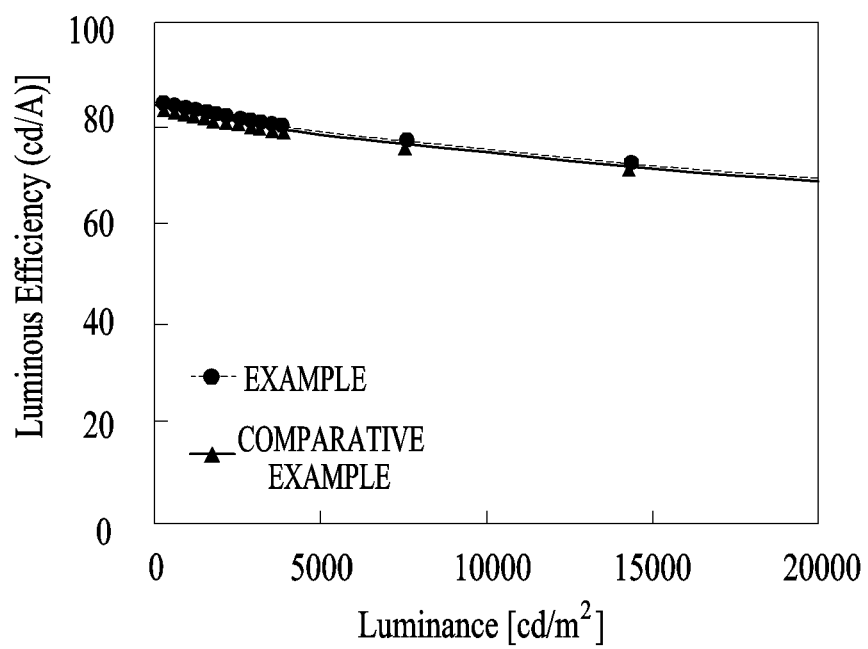

As shown in Table 1 and FIG. 4A, drive voltage to obtain a current density of 10 mA/cm$^2$ in the example is 0.2 V lower than that in the comparative example. In addition, luminous efficiency in the example is 0.5 cd/A higher than that in the comparative example as shown in Table 1, and external quantum efficiency in the example is 0.2% higher than that in the comparative example as shown in Table 1 and FIG. 4B. Furthermore, in the example, the peak intensity is at a wavelength of 530 to 570 nm, in which a yellow-green (YG) is emitted, which is similar to that in the comparative example.

Table 2 shows characteristics of a first light emitting unit generating a blue light of the white organic light emitting device according to the first embodiment of the present invention and a comparative example.

TABLE 2

| | 10 mA/cm² | | |
|---|---|---|---|
| N-type charge generation layer | Drive voltage (V) | Luminous efficiency (cd/A) | External quantum efficiency EQE (%) |
| Comparative example | 4.0 | 8.1 | 9.8 |
| Example | 4.0 | 8.3 | 10.0 |

Figure 5A:
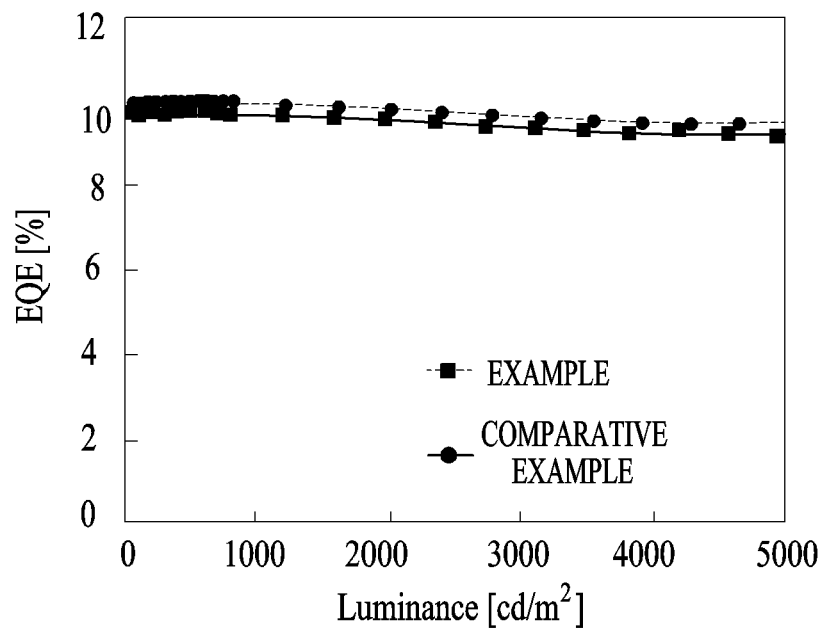
FIGS. 5A and 5B are graphs showing characteristics of a first light emitting unit generating a blue light illustrated in FIG. 1 and a comparative example.
Figure 5B:
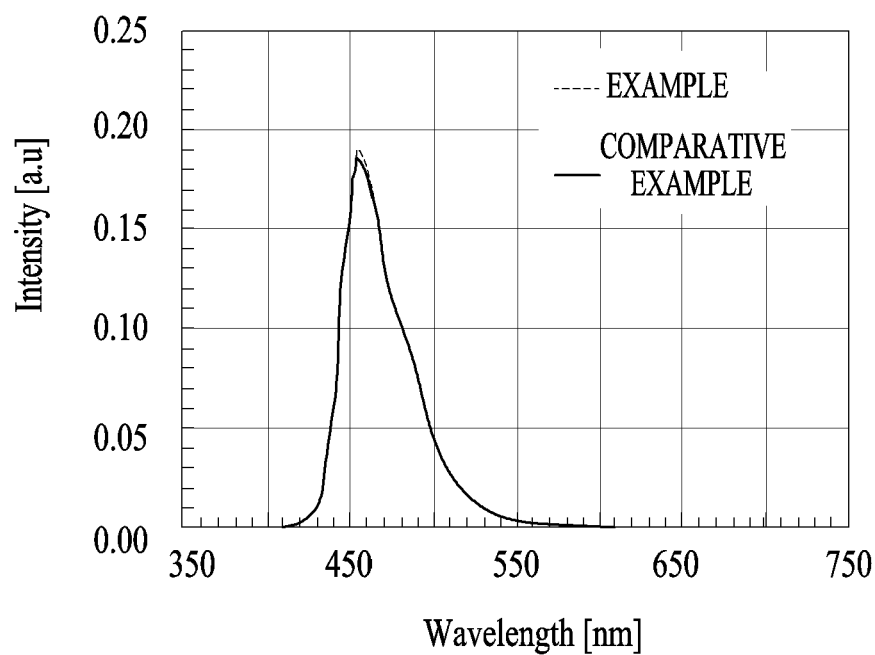

As shown in Table 2, drive voltage to obtain a current density of 10 mA/cm2 in the example is equal to that in the comparative example. In addition, luminous efficiency in the example is 0.2 cd/A higher than that in the comparative example as shown in Table 2, and external quantum efficiency in the example is 0.2% higher than that in the comparative example as shown in Table 2 and FIG. 5A. Furthermore, in the example, the peak intensity is at a wavelength of 450 to 475 nm, in which a blue (B) light is emitted, which is higher than that in the comparative example, as shown in FIG. 5B.

Table 3 shows characteristics of the white organic light emitting device according to the first embodiment of the present invention and a comparative example.

TABLE 3

| | 10 mA/cm² | | |
|---|---|---|---|
| N-type charge generation layer | Drive voltage (V) | Luminous efficiency (cd/A) | External quantum efficiency EQE (%) |
| Comparative example | 7.7 | 77.0 | 32.6 |
| Example | 7.5 | 79.3 | 32.9 |

Figure 6A:
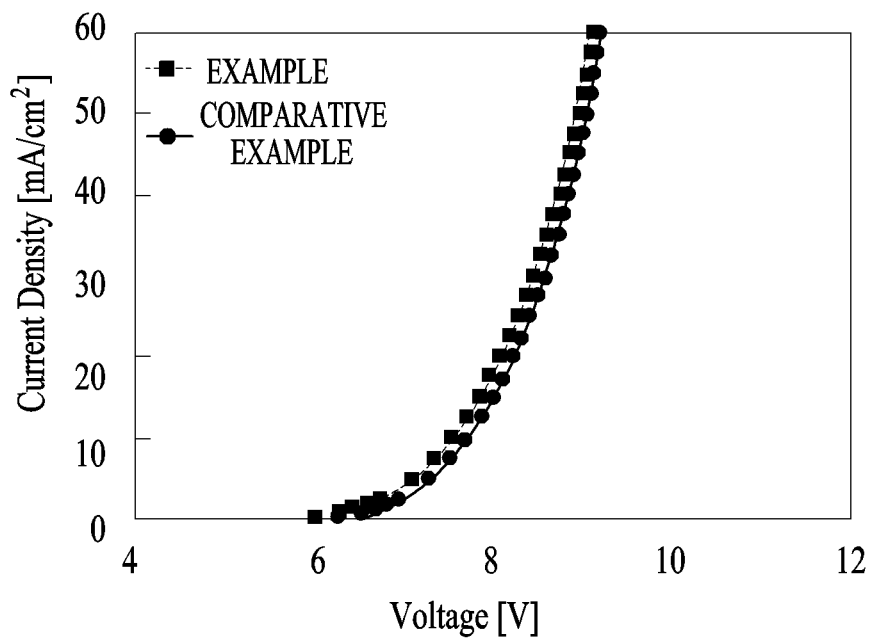
FIGS. 6A to 6C are graphs showing characteristics of a white organic light emitting device according to the first embodiment of the present invention and a comparative example.
Figure 6B:
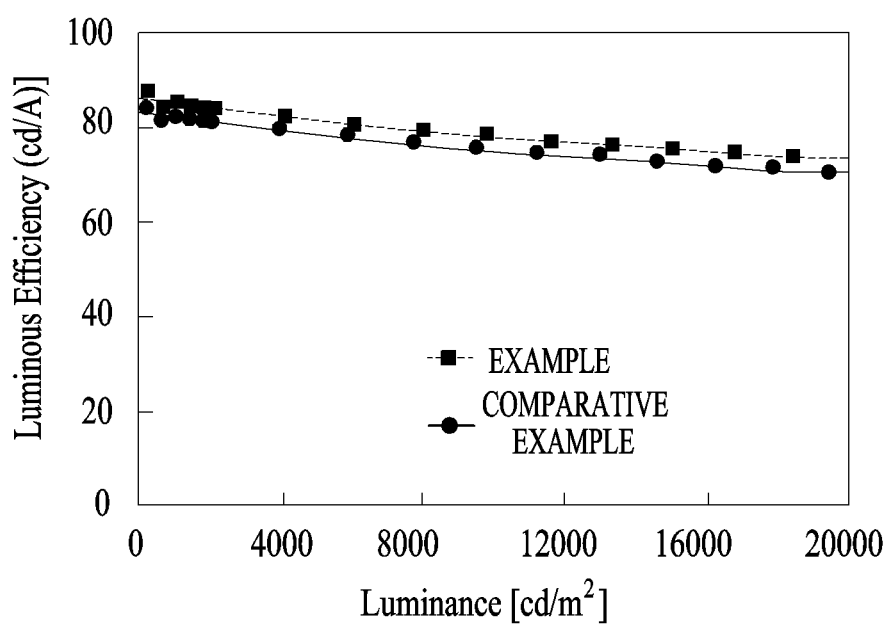
Figure 6C:
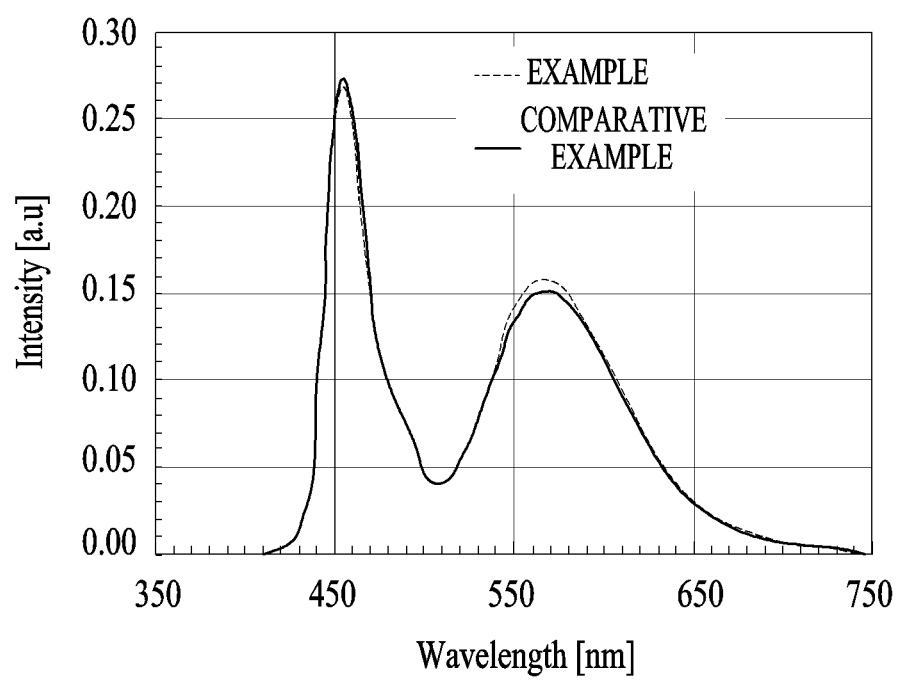

As shown in Table 3 and FIG. 6A, drive voltage to obtain a current density of 10 mA/cm2 in the example is 0.2V lower than that in the comparative example. In addition, luminous efficiency in the example is 2.3 cd/A higher than that in the comparative example as shown in Table 3 and FIG. 6B, and external quantum efficiency in the example is 0.3% higher than that in the comparative example as shown in Table 3. Furthermore, in the example, the peak intensities are at a wavelength of 450 to 475 nm, in which a blue (B) light is emitted, and at a wavelength of 530 to 570 nm, in which a yellow-green (YG) light is emitted, which is higher than that in the comparative example, as shown in FIG. 6C.

Figure 7:
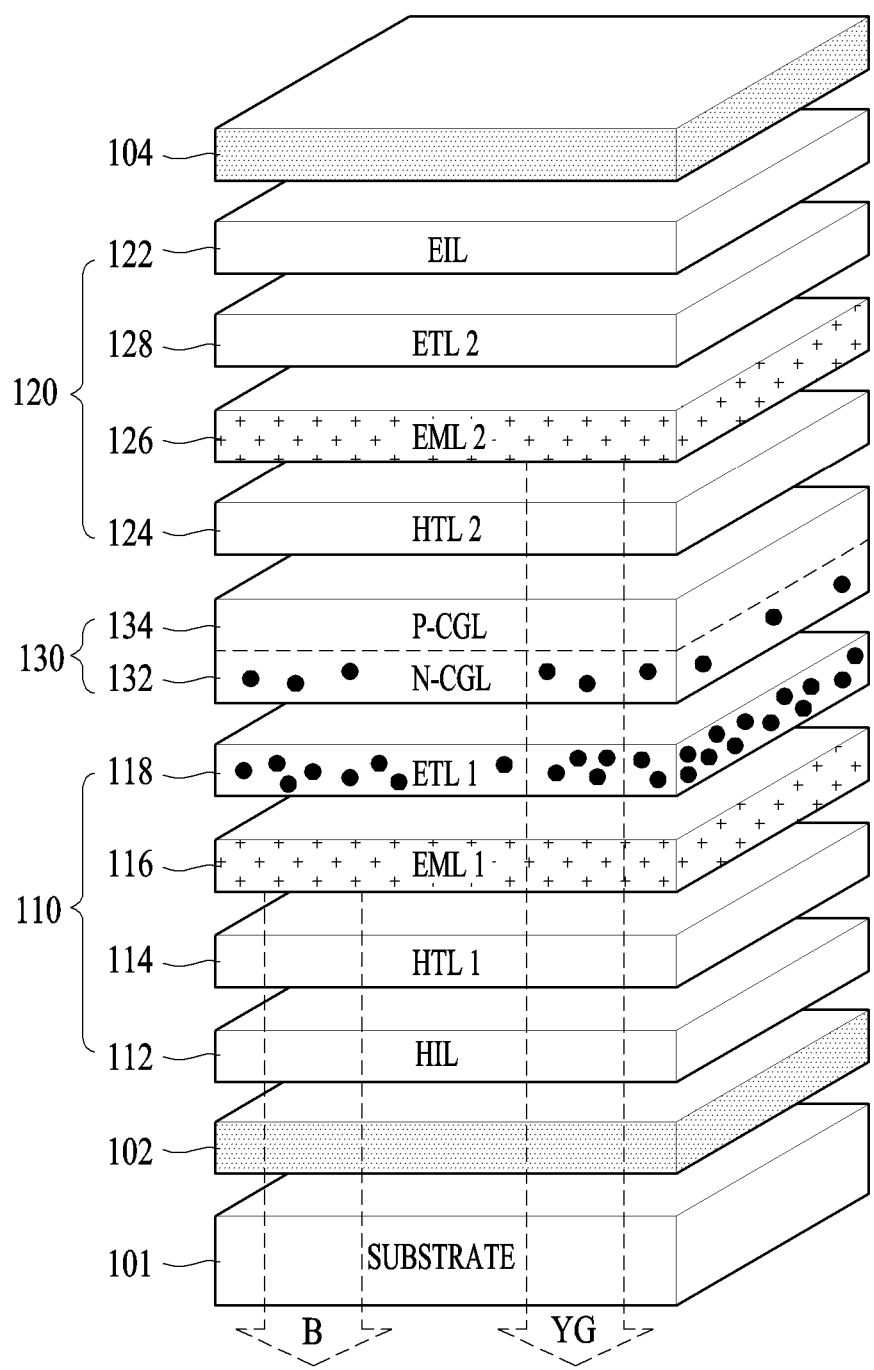
FIG. 7 is a perspective view illustrating an OLED device according to a second embodiment of the present invention.

FIG. 7 is a perspective view illustrating an OLED device according to a second embodiment of the present invention. The OLED device illustrated in FIG. 7 is substantially identical to what is shown in FIG. 1, except that an N-type charge generation layer and a first electron transport layer include the same host. Thus, a detailed description of the identical elements will be omitted.

Referring to FIG. 7, a first electron transport layer 118 is formed of the same material as any one of a plurality of hosts included in an N-type charge generation layer 132. As a result, an energy barrier between the first electron transport layer 118 and the N-type charge generation layer 132 may be reduced or minimized, and thus electrons may be easily injected into the first electron transport layer 118. The first electron transport layer 118 may have a thickness De in a range of about 100 Å to about 500 Å.

The N-type charge generation layer 132 includes at least two hosts formed of different materials and a dopant. In this embodiment, the N-type charge generation layer 132 includes first and second hosts H1 and H2 formed of different materials and a dopant D by way of example.

Figure 8A:
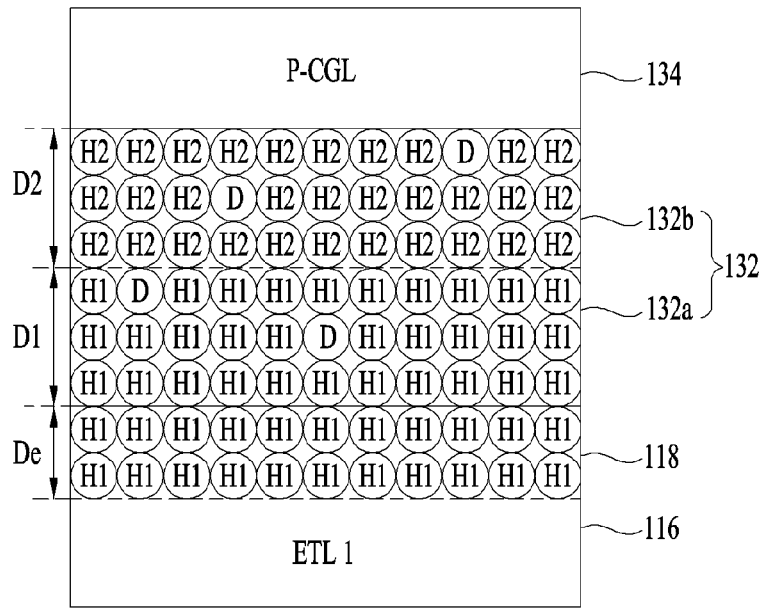
FIGS. 8A to 8C are sectional views illustrating various embodiments of an N-type charge generation layer shown in FIG. 7.
Figure 8B:
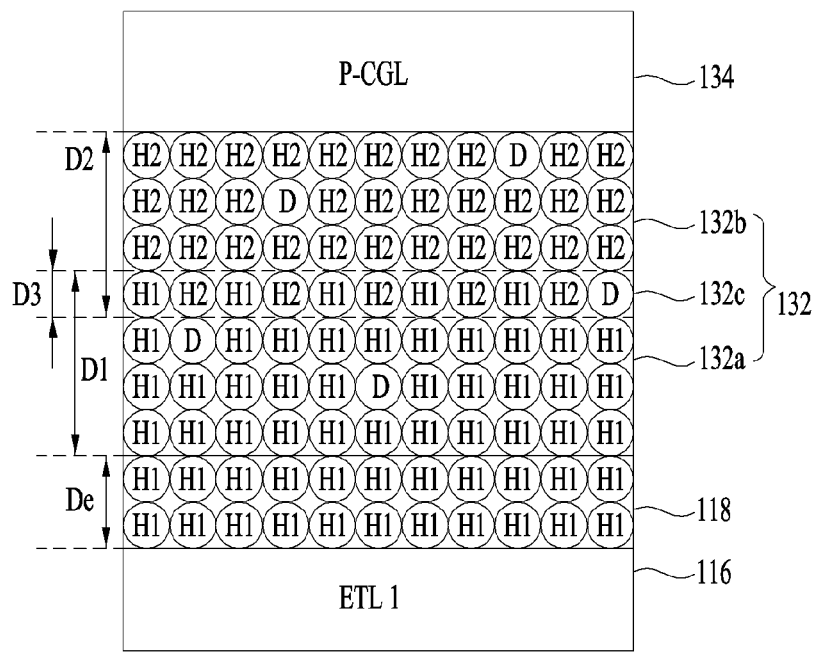
Figure 8C:
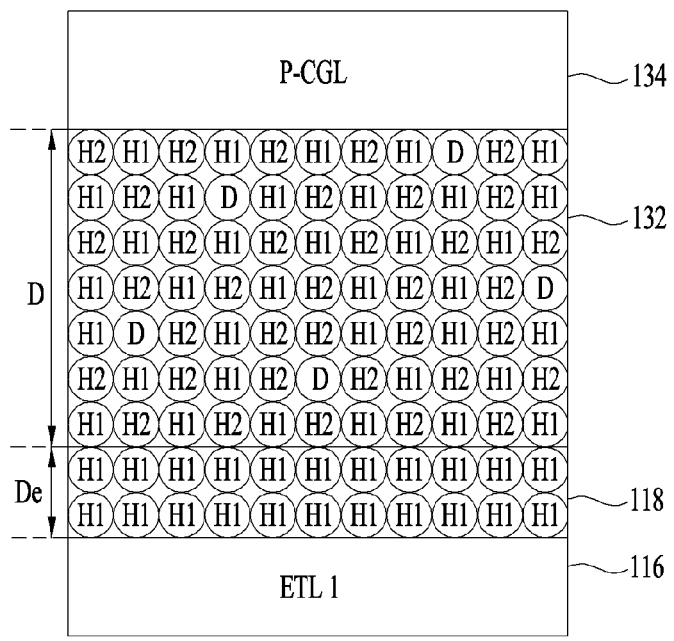

The N-type charge generation layer 132 may have a multi-layer structure as illustrated in FIGS. 8A and 8B or a single-layer structure as shown in FIG. 8C.

The N-type charge generation layer 132 illustrated in FIG. 8A includes first and second N-type charge generation layers 132a and 132b. The first N-type charge generation layer 132a is formed by mixing the first host H1 and the dopant D on the first electron transport layer 118 formed of the first host H1. The second N-type charge generation layer 132b is formed by mixing the second host H2 and the dopant D on the first N-type charge generation layer 132a. Thicknesses D1 and D2 of the first and second N-type charge generation layers 132a and 132b may be in a range of about 10 Å to about 500 Å.

The N-type charge generation layer 132 illustrated in FIG. 8B includes first to third second N-type charge generation layers 132a, 132b, and 132c. The first N-type charge generation layer 132a is formed by mixing the first host H1 and the dopant D on the first electron transport layer 118 formed of the first host H1. The second N-type charge generation layer 132b is formed by mixing the second host H2 and the dopant D on the third N-type charge generation layer 132c. The third N-type charge generation layer 132c is formed by mixing the first and second hosts H1 and H2 and the dopant D between the first and second N-type charge generation layers 132a and 132b. In the N-type charge generation layer 132, a thickness D1 of a region in which the first host H1 is formed and a thickness D2 of a region in which the second host H2 is formed may be in a range of about 10 Å to about 500 Å. A thickness D3 of a region in which the first host H1 and the second host H2 are formed in a mixed state, i.e. the third N-type charge generation layer 132c, may be in a range of about 10 Å to about 500 Å.

The N-type charge generation layer 132 illustrated in FIG. 8C is formed by mixing the first and second hosts H1 and H2 and the dopant D. That is, the N-type charge generation layer 132 has a single-layer structure. A doping amount of the first host H1 of the N-type charge generation layer 132 increases from the upper part to the lower part of the N-type charge generation layer 132. A doping amount of the second host H2 of the N-type charge generation layer 132 decreases from the upper part to the lower part of the N-type charge generation layer 132. The N-type charge generation layer 132 may have a thickness D in a range of about 10 Å to 500 Å.

As described above, because the first host H1 is adjacent to the first electron transport layer 118 in the N-type charge generation layer 132 as illustrated in FIGS. 8A to 8C, electrons may easily move to the first emission layer 116 with a lower energy barrier through the first electron transport layer 118. In addition, because the second host H2 is adjacent to the P-type charge generation layer 134 in the N-type charge generation layer 132 as illustrated in FIGS. 8A to 8C, electrons generated by the P-type charge generation layer 134 may be easily injected.

In the N-type charge generation layer 132 illustrated in FIGS. 8A to 8C, a ratio of the second host H2 to the first host H1 may be in a range of about 5% to about 95%. In the N-type charge generation layer 132, a doping ratio of the dopant D to the sum of the first and second hosts H1 and H2 may be in a range of about 1% to about 8%. The dopant D may be formed of an alkali metal or an alkali earth metal, such as Ca, Li, Mg, or Yb, and may have a work function of about −2.5 eV to about −3.2 eV.

Figure 9A:
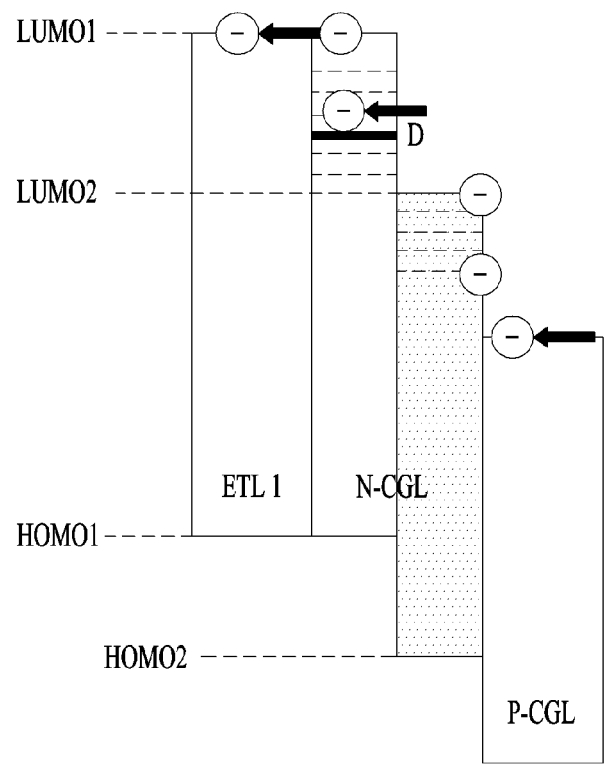
FIGS. 9A and 9B are views illustrating an electron movement channel between a P-type charge generation layer and an electron transport layer shown in FIGS. 8A to 8C.
Figure 9B:
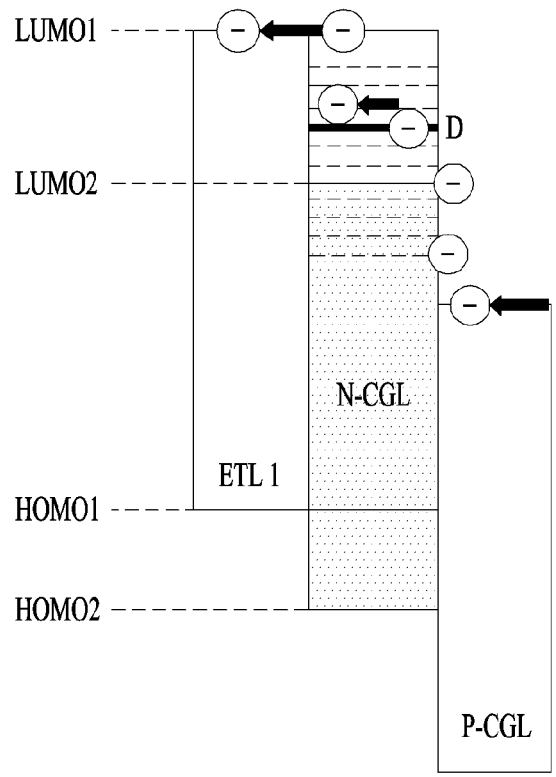

As illustrated in FIGS. 9A and 9B, the first and second hosts H1 and H2 have different LUMO energy levels and different HOMO energy levels. For example, the difference between the LUMO energy level (LUMO1) of the first host H1 and the LUMO energy level (LUMO2) of the second host H2 may be about 0.1 eV or more and the difference between the HOMO energy level (HOMO1) of the first host H1 and the HOMO energy level (HOMO2) of the second host H2 may be about 0.1 eV or more.

Because the N-type charge generation layer 132 has at least two hosts as described above, the charge generation layer may have plural energy levels. In particular, at least two hosts and a dopant constituting the N-type charge generation layer 132 are co-deposited to generate a plurality of energy levels. These energy levels are used as movement channels through which electrons generated by the P-type charge generation layer 134 are injected as illustrated in FIGS. 9A and 9B.

In particular, because the first electron transport layer 118 includes the same material as one of the hosts included in the N-type charge generation layer 132 as illustrated in FIGS. 9A and 9B, an energy barrier between the N-type charge generation layer 132 and the electron transport layer 118 may be reduced or minimized such that electrons can be easily injected. As a result, a drive voltage of the OLED device according to an embodiment of the present invention can be lowered. In addition, because the LUMO energy level (LUMO2) of the second host H2 is lower than the LUMO energy level (LUMO1) of the first host H1, electrons may be easily injected from the P-type charge generation layer 134. As a result, the drive voltage can be further lowered, thereby improving luminous efficiency.

Figure 10A:
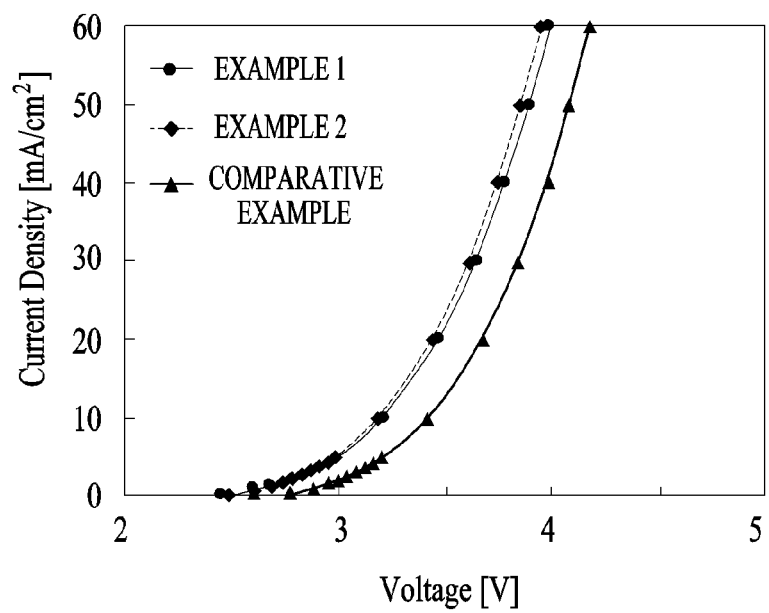
FIGS. 10A and 10B are graphs showing characteristics of an OLED device illustrated in FIG. 7 and a comparative example.
Figure 10B:
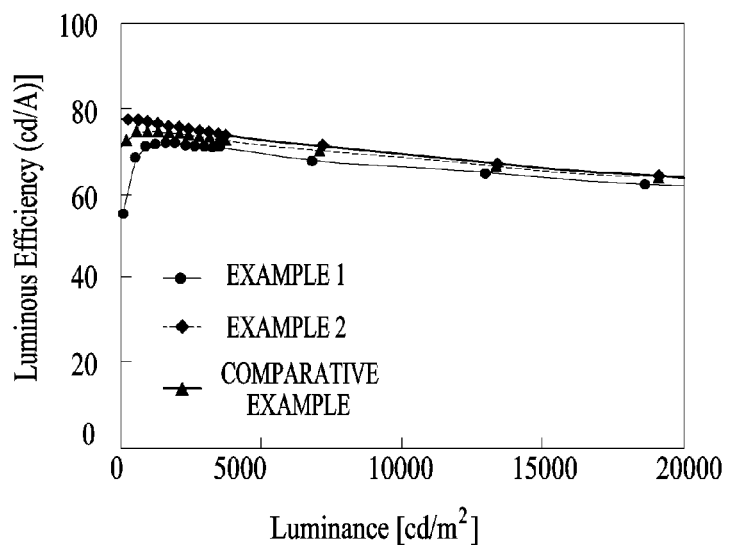

FIGS. 10A and 10B, and Table 4, show characteristics of a white organic light emitting device according to the second embodiment of the present invention illustrated in FIG. 7.

In FIGS. 10A and 10B, and Table 4, the comparative example includes a first electron transport layer formed of Alq3 and an N-type charge generation layer formed of Bphen, example 1 includes an N-type charge generation layer 132 having a multi-layer structure as illustrated in FIGS. 8A and 8B and a first electron transport layer 118 formed of the same material as any one of first and second hosts H1 and H2 included in the N-type charge generation layer 132, and example 2 includes an N-type charge generation layer 132 having a single-layer structure as illustrated in FIG. 8C and a first electron transport layer 118 formed of the same material as any one of the hosts included in the N-type charge generation layer 132. In the N-type charge generation layer 132 of examples 1 and 2, one of the first and second hosts H1 and H2 is formed of a pyrene derivative having a phenanthroline substituent and the other of the first and second hosts H1 and H2 is formed of Bphen. In this embodiment, the materials of the first and second hosts H1 and H2 are merely illustrative for understanding of the present invention and, therefore, the present invention is not limited thereto.

Table 4 shows characteristics of a white organic light emitting device according to the second embodiment of the present invention and a comparative example.

TABLE 4

| N-type charge generation layer | 10 mA/cm² | | |
| --- | --- | --- | --- |
| | Drive voltage (V) | Luminous efficiency (cd/A) | External quantum efficiency EQE (%) |
| Example 1 | 3.2 | 69.2 | 20.5 |
| Example 2 | 3.2 | 71.2 | 21.0 |
| Comparative example | 3.4 | 70.4 | 20.8 |

As shown in Table 4 and FIG. 10A, drive voltage to obtain a current density of 10 mA/cm2 in examples 1 and 2 is 0.2 V lower than that in the comparative example. In addition, luminous efficiency in example 2 is 0.8 cd/A higher than that in the comparative example as shown in Table 4 and FIG. 10B, and external quantum efficiency in example 2 is 0.2% higher than that in the comparative example as shown in Table 4.

Figure 11:
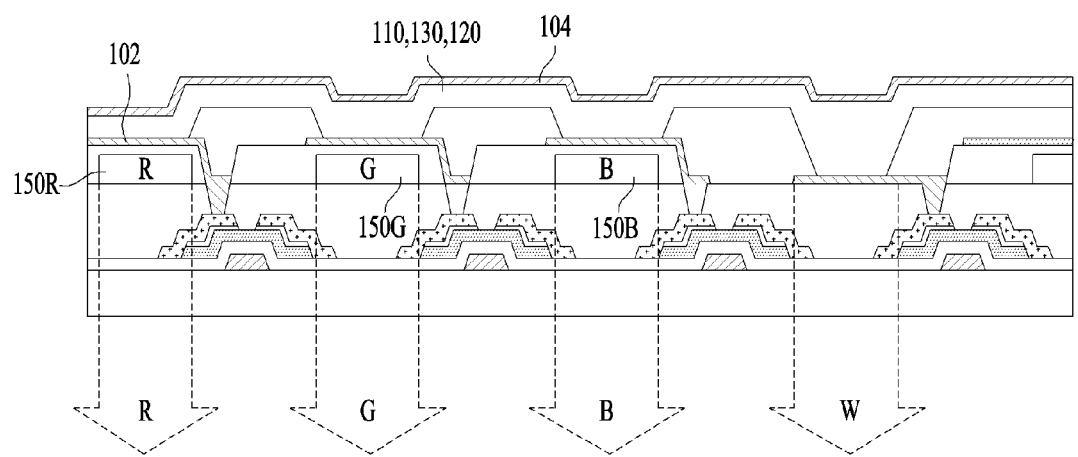
FIG. 11 is a sectional view illustrating an OLED device having a color filter according to an embodiment of the present invention.

FIG. 11 is a sectional view illustrating an OLED device having a color filter according to an embodiment of the present invention.

An OLED device according to embodiments of the present invention may be applied to a structure that has a drive thin film transistor connected to a first electrode and a plurality of red, green, and blue color filters 150R, 150G, and 150B, as illustrated in FIG. 11. That is, a white light generated through the charge generation layer and the first and second light emitting units 110 and 120 is converted to a red light while passing through a sub-pixel region having the red color filter 150R, a green light while passing through a sub-pixel region having the green color filter 150G, a blue light while passing through a sub-pixel region having the blue color filter 150B, and a white light while passing through a sub-pixel region having no color filter.

In the embodiments described above, a structure having two light emitting units has been described by way of example. However, the present invention is not limited thereto, and one of ordinary skill in the art would understand that three or more light emitting units may be provided in an OLED device according to the present invention.

As is apparent from the above description, an OLED device according to an embodiment of the present invention is configured such that the N-type charge generation layer includes at least two hosts and, therefore, a plurality of energy levels, which are movement channels through which electrons generated by the P-type charge generation layer may be injected, is provided. As a result, electrons may be more easily injected into the emission layer(s) compared with the conventional art, thereby lowering drive voltage. Furthermore, the balance between holes and electrons may be uniform, which may increase luminous efficiency. In addition, the first electron transport layer is formed of the same material as any one of the hosts included in the N-type charge generation layer. As a result, an energy barrier between the N-type charge generation layer and the electron transport layer may be reduced or minimized such that electrons are easily injected, and that the drive voltage may be thus lowered and luminous efficiency may be increased.

It will be apparent to those skilled in the art that various modifications and variation can be made in the present invention without departing from the spirit or scope of the invention. Thus, it is intended that the present invention cover the modifications and variations of this invention provided they come within the scope of the appended claims and their equivalents.

What is claimed is:

1. An organic light emitting display (OLED) device comprising:
    first and second electrodes facing each other on a substrate;
    at least two light emitting units between the first and second electrodes; and
    a charge generation layer between the at least two light emitting units, the charge generation layer including an N-type charge generation layer and a P-type charge generation layer,
    wherein the N-type charge generation layer comprises at least two hosts and a dopant, and wherein the at least two hosts have different lowest unoccupied molecular orbital (LUMO) energy levels.

2. The OLED device according to claim 1, wherein the N-type charge generation layer has a multi-layer or single-layer structure comprising first and second hosts and the dopant.

3. The OLED device according to claim 2, wherein
    a difference between the LUMO energy level of the first host and the LUMO energy level of the second host is about 0.1 eV or more, and
    a difference between a highest occupied molecular orbital (HOMO) energy level of the first host and a HOMO energy level of the second host is about 0.1 eV or more.

4. The OLED device according to claim 2, wherein a ratio of the second host to the first host in the N-type charge generation layer is about 5% to about 95% and a doping ratio of the dopant to the sum of the first and second hosts in the N-type charge generation layer is about 1% to about 8%.

5. The OLED device according to claim 2, wherein the dopant includes an alkali metal or an alkali earth metal and has a work function of about −2.5 eV to about −3.2 eV.

6. The OLED device according to claim 2, wherein the N-type charge generation layer has a multi-layer structure comprising:
    a first N-type charge generation layer including the first host and the dopant;
    a second N-type charge generation layer including the second host and the dopant; and
    a third N-type charge generation layer including the first and second hosts and the dopant.

7. The OLED device according to claim 6, wherein the first to third N-type charge generation layers each has a thickness of about 10 Å to about 500 Å.

8. The OLED device according to claim 2, wherein the N-type charge generation layer has a multi-layer structure comprising:
    a first N-type charge generation layer including the first host and the dopant; and
    a second N-type charge generation layer including the second host and the dopant.

9. The OLED device according to claim 8, wherein the first and second N-type charge generation layers each has a thickness of about 10 Å to about 500 Å.

10. An organic light emitting display (OLED) device comprising:
    first and second electrodes facing each other on a substrate;
    at least two light emitting units formed between the first and second electrodes; and
    a charge generation layer formed between the at least two light emitting units, the charge generation layer comprising an N-type charge generation layer and a P-type charge generation layer, wherein
    one of the at least two light emitting units comprises:
    a hole transport layer on the first electrode;
    an emission layer on the hole transport layer; and
    an electron transport layer on the emission layer,
    the N-type charge generation layer on the electron transport layer, the N-type charge generation layer including at least two hosts having different LUMO energy levels and a dopant, and
    the electron transport layer including any one of the at least two hosts in the N-type charge generation layer.

11. The OLED device according to claim 10, wherein the N-type charge generation layer has a multi-layer or single-layer structure comprising first and second hosts and a dopant.

12. The OLED device according to claim 11, wherein
    a difference between the LUMO energy level of the first host and the LUMO energy level of the second host is about 0.1 eV or more, and
    a difference between a HOMO energy level of the first host and a HOMO energy level of the second host is about 0.1 eV or more.

13. The OLED device according to claim 11, wherein a ratio of the second host to the first host in the N-type charge generation layer is about 5% to 95% and a doping ratio of the dopant to the sum of the first and second hosts in the N-type charge generation layer is about 1% to 8%.

14. The OLED device according to claim 11, wherein the dopant includes an alkali metal or an alkali earth metal and has a work function of about −2.5 eV to about −3.2 eV.

15. The OLED device according to claim 11, wherein the N-type charge generation layer has a multi-layer structure comprising:
    a first N-type charge generation layer including the first host and the dopant;
    a second N-type charge generation layer including the second host and the dopant; and
    a third N-type charge generation layer including the first and second hosts and the dopant.

16. The OLED device according to claim 15, wherein the first to third N-type charge generation layers each has a thickness of about 10 Å to about 500 Å.

17. The OLED device according to claim 11, wherein the N-type charge generation layer has a multi-layer structure comprising:
    a first N-type charge generation layer including the first host and the dopant; and
    a second N-type charge generation layer including the second host and the dopant.

18. The OLED device according to claim 17, wherein the first and second N-type charge generation layers each has a thickness of about 10 Å to about 500 Å.

19. The OLED device according to claim 11, wherein the electron transport layer has a thickness of about 100 Å to about 500 Å.

20. A method for manufacturing an organic light emitting display (OLED) device, the method comprising:
    forming a first electrode on a substrate;
    forming a first light emitting unit on the first electrode;
    forming a charge generation layer on the first light emitting unit, the charge generation layer including a first host, a second host and a dopant;
    forming a second light emitting unit on the charge generation layer; and
    forming a second electrode on the second light emitting unit,
    wherein LUMO energy levels of the first host and the second host are different by about 0.1 eV or more, and
    wherein HOMO energy levels of the first host and the second host are different by about 0.1 eV or more.

* * * * *